United States Patent

Ho

[15] 3,644,850

[45] Feb. 22, 1972

[54] INTEGRATED CIRCUIT BAND PASS FILTER

[72] Inventor: Irving T. Ho, Poughkeepsie, N.Y.

[73] Assignee: International Business Machines Corporation, Armonk, N.Y.

[22] Filed: June 11, 1969

[21] Appl. No.: 832,303

[52] U.S. Cl. ..............................333/73, 317/235, 333/31 R, 333/84 M

[51] Int. Cl. ......................................H01p 3/08, H01s 19/00

[58] Field of Search ....................333/70, 18, 84 M; 317/234; 330/5; 343/5

[56] References Cited

UNITED STATES PATENTS

| | | | |
|---|---|---|---|
| 3,508,125 | 4/1970 | Ertel | 317/234 |
| 3,454,906 | 7/1969 | Hyltin | 333/31 |
| 3,212,032 | 10/1965 | Kaufman | 333/70 R |
| 3,416,042 | 12/1965 | Thomas et al. | 317/234 |
| 3,257,631 | 6/1966 | Evans | 333/70 |
| 3,022,472 | 2/1962 | Tannenbaum | 333/18 |
| 3,386,092 | 5/1968 | Hyltin | 343/5 |

*Primary Examiner*—Herman Karl Saalbach
*Assistant Examiner*—C. Baraff
*Attorney*—Hanifin and Jancin and William S. Robertson

[57] ABSTRACT

A semiconductor band pass filter is disclosed. The filter is an integrated circuit device having a semiconductor layer with a ground plane on one face and an insulating layer and an overlying conductive line on the other face. The semiconductor layer includes near the insulating layer a highly doped region which may have substantially the same pattern as the conductive line. The passed band can be selected by varying the doping level of the doped region.

2 Claims, 4 Drawing Figures

INVENTOR
IRVING T HO

BY W. S. Robertson
A. Sidney Alpert
ATTORNEYS

INTEGRATED CIRCUIT BAND PASS FILTER

BACKGROUND OF THE INVENTION

The present invention relates generally to filter devices, and more particularly to integrated circuit band pass filter devices.

A band pass filter comprises capacitance, inductance and resistance elements arranged to pass frequencies within a continuous band, defined by an upper and a lower cutoff frequency, and substantially to attenuate all frequencies above and below that band. Band pass filters may include series and parallel circuits that are tuned to the center frequency of the band to be passed. Many such circuit arrangements are known to the art, and several types of devices have been used in the construction of band pass filters. The present invention is particularly concerned with an integrated circuit filter that is especially well suited to semiconductor technologies since its construction is entirely compatible with the usual integrated circuit construction and circuit elements such as transistors.

Integrated circuit filters are known to the prior art, as exemplified in U.S. Pat. Nos. 3,148,344, 3,210,696 and 3,233,196. Such filters for example use the capacitance of a reverse biased PN-junction. The filter of the present invention has several important advantages over such PN-junction filters, including the fact that it does not require a junction biasing voltage, and that the pass band is selectable by simple adjustment during fabrication.

It is an object of the present invention to provide an integrated circuit band pass filter that is compatible with other integrated circuit elements and structures.

It is another object of the present invention to provide a band pass integrated circuit filter that is readily adjustable during fabrication so as to pass preselected frequencies.

It is another object of the present invention to provide an integrated circuit band pass filter device that is compatible with other integrated circuit structures, is simple and inexpensive in construction, yet is efficient and accurate in operation.

SUMMARY OF THE INVENTION

The embodiment of the invention that will be described in detail later is an integrated circuit structure that operates as a filter circuit for selected frequencies; preferably as a band pass filter. It is compatible with integrated circuit structures and it is contemplated that it will find usage as a "packaged" circuit along with other circuit elements on a semiconductor chip. The preferred embodiment includes a lightly doped semiconductor layer having a metallic ground plane on one face and a thin dielectric layer on the opposite face. Overlying the dielectric coating is a conductive line having a predetermined size and pattern, presenting preselected values of series resistance, inductance and (preferably) capacitance. A highly doped region of the same conductivity type as the semiconductor layer, which may have the same pattern as the conductive line, is disposed between the semiconductor layer and the dielectric layer. The doped region provides a means for preselecting the frequency response of the filter during fabrication of the device by varying certain resistance characteristics of the filter.

DESCRIPTION OF THE PREFERRED EMBODIMENT

Conventional Features

Figure 1:
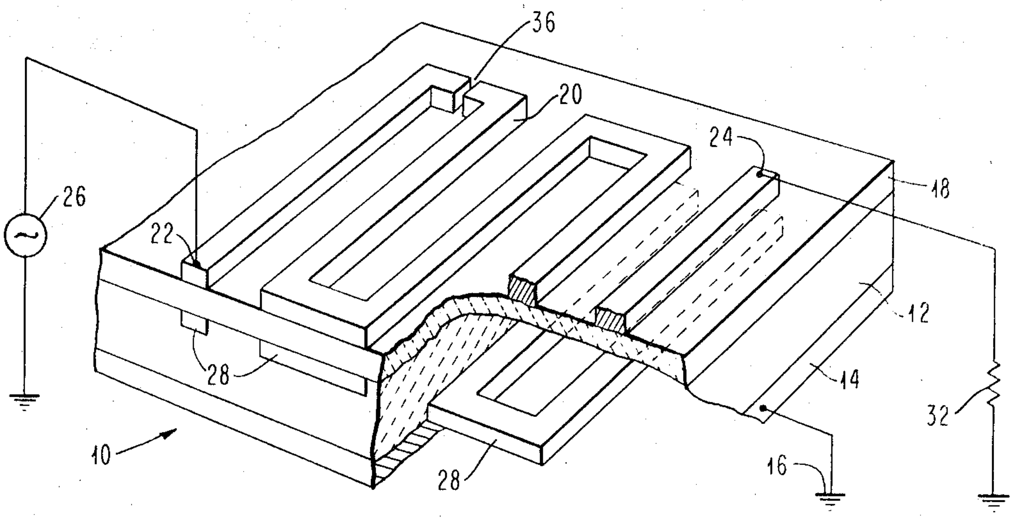
FIG. 1 is a perspective view of the integrated circuit band pass filter device of this invention.
Figure 2:
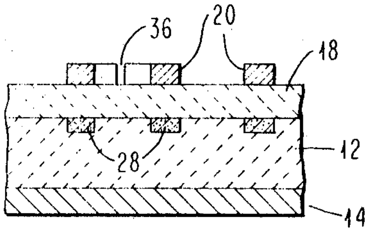
FIG. 2 is an enlarged vertical sectional view through the device shown in FIG. 1.

FIGS. 1 and 2 illustrate an integrated circuit band pass filter device 10 according to the present invention. A wafer 12 of semiconductor material forms the body of the integrated circuit band pass filter device and may form the body or supporting structure or substrate for other circuit elements or components located on the same chip or substrate. In the preferred embodiment, the semiconductor wafer is an N-type silicon substrate, although, other semiconductor material such as P-type silicon or even germanium or gallium arsenate substrate may be used. Preferably, the silicon substrate is approximately eight mils thick.

A layer 14 of conducting material, preferably aluminum, is fixed to the lower surface of silicon substrate 12 as the device is oriented in the drawing. Layer 14 provides a ground plane as the schematic ground 16 represents. The ground plane 14 may be formed of aluminum on the silicon layer by conventional techniques such as by vapor deposition.

A layer 18 of insulating material is affixed to the other side of the silicon layer 12. In the illustrated embodiment, the layer 18 is silicon dioxide, which can be placed directly on the surface of silicon layer 12 by conventional techniques. Other insulating materials such as nitride may be used in place of silicon dioxide so long as the insulating material has suitable characteristics of a dielectric for a capacitor C1 described later.

Located on the insulating silicon dioxide layer 18 and conductively insulated from region 12 is a conductive line 20 of a size and pattern to provide a preselected value of resistance. The conductive line 20 in the illustrated embodiment is aluminum, and is readily formed on layer 18 by suitable techniques such as by vapor deposition through a mask. The conductive line 20 is connected at point 22 to a preceding circuit shown for generality as a schematic signal source 26 and is connected at a point 24 to a next circuit shown for generality as a resistor 32.

The components of the filter that have been described so far are common to many semiconductor structures. The series inductance, resistance, and capacitance of the line 20 and the capacitance and resistance to the ground of line 20 give this simplified structure a particular frequency response, as is well known. The features of this invention that provide a frequency response suitable for a filter will be described next.

The Frequency Response Controlling Structure

There is located essentially between the silicon dioxide insulating layer 18 and the silicon substrate layer 12 a highly doped region 28 of the same conducting type as the silicon layer 12. (Region 28 is N+ type material in the illustrated embodiment). The region 28 is formed by a conventional diffusion process on top of the substrate layer 12 but could be formed in other ways. In the device 10 shown in FIGS. 1 and 2, the highly doped region 28 may have essentially the same pattern and size as the conducting line 20, or may be a rectangular diffusion under line 20.

OPERATION

Figure 3:
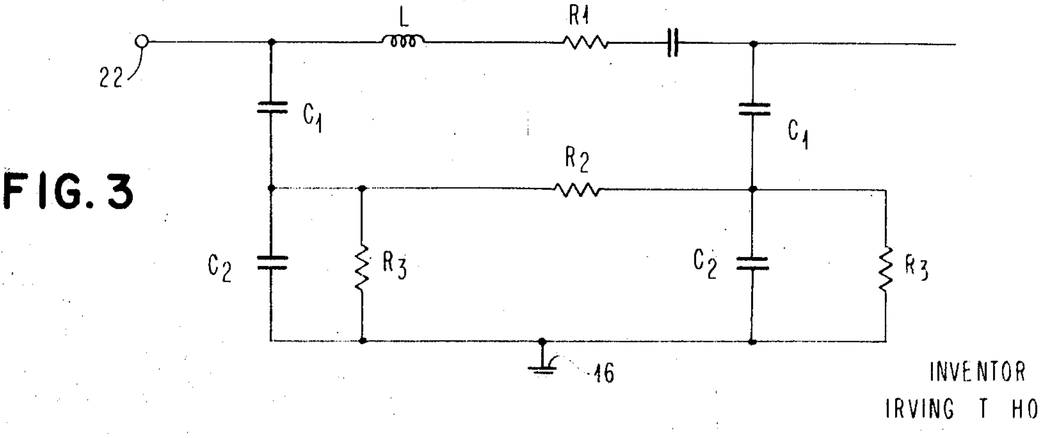
FIG. 3 is an equivalent electrical circuit of the band pass filter device shown in FIGS. 1 and 2.

By referring to FIG. 3 in connection with FIGS. 1 and 2, the operating theory of the band pass filter circuit 10 will become apparent. The spacing between conductive line 20 and ground plane 14 gives the line 20 a large value of series inductance L. Line 20 also has a resistance R1, the value of which is established by the length and the cross-sectional area of the line. In the illustrated embodiment, the aluminum conductive line is approximately 2.2 mils wide, and 5,000 A. thick. The conductive line 20 has a virtual ground plane located essentially at the boundary of silicon dioxide layer 18 and silicon region 28. Accordingly, since the silicon dioxide layer 18 is a rather thin layer (approximately 5,000 A. in thickness in the embodiment of FIG. 1) the capacitance C1 between line 20 and region 28 is rather large. There is also a lesser capacitance between the conductive line 20 and the ground plane 14, designated C2 in FIG. 3. Resistor R3 in FIG. 3 represents the resistance through the device layer 12.

The filter device 10 utilizes the semiconductor effect of layer 12 to achieve a multilayer network in order to attain the characteristics of a band pass circuit.

Figure 4:
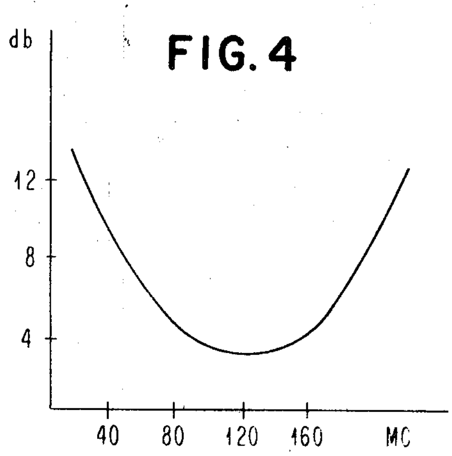
FIG. 4 is an attenuation curve illustrating the pass band frequency for the preferred embodiment of the present invention.

The circuit of FIG. 3 can be understood by considering the predominant paths taken by signals of the passed band and signals above and below the passed band. At a frequency of 120 mc. for example, as illustrated in FIG. 4, the upper boundary of the region 28 acts as a virtual ground plane to form a capacitor C1, since there is sufficient time for the charges from the aluminum ground plane 14 to migrate to that boundary. When voltage is applied to the filter device 10, the low frequency portion of the waveform takes the series path through the conductive line 20 or through L and R1 and series capacitor 36 is thereby severely attenuated. The high-frequency components of the waveform take the path through the various layers of the device to ground 16, or through C1 and C2 and are also severely attenuated. However, medium frequency components of the waveform, in the band to be passed, take the C1, R2 path and are very lightly attenuated.

Preferably, the region 28 has a simple rectangular form within the outline of the tortuous path of FIG. 1 to form a short, low-resistance path between point 22 and point 24. In the embodiment of FIG. 1 capacitive coupling and resistive coupling between parallel segments of region 28 supplement the conductive path represented by resistor R2 in FIG. 3. Region 28 also has somewhat less inductance than line 20 because it is nearer the ground plane 14. The doped region 28 is provided in order to reduce the resistance value R2 which would otherwise be rather large because of the low conductivity of the silicon substrate. Thus, as an important feature of the present invention, there is readily available means of controlling the selectivity characteristic of the filter, by the simple means of controlling the doping level of region 28. The doped region 28 permits the valve of R2 to be controlled and it is thereby possible to directly establish the frequency band to be passed simply through the appropriate selection of the doping level of the region 28 during fabrication of the device 10. In the preferred device, the region 28 has a conductivity of 0.1 ohm-cm. Further, the fabrication of the device is relatively simple, as the doping of region 28 may be accomplished while fabricating other components on the chip, and additional doping is not required. It will be appreciated, therefore, that the band pass filter 10 is compatible with other integrated circuits to be produced on the same chip, and that the value of R2 may be controlled over several orders of magnitude. Thus, the center frequency of the pass band may be chosen from a wide frequency spectrum enabling the device 10 to be used, for example, in microwave integrated circuits, or television channel selection.

The attenuation curve 33 of FIG. 4 plots attenuation in decibels against frequency for the device previously described, and illustrates the usefulness of the device as a band pass filter. Thus, the frequency of the passed band is approximately 110–130 mc. These measurements were made across the load resistor 32, having a value of 50 ohms.

Other Embodiments

In the embodiment of FIG. 1, the single capacitor 36 has a large capacitance and functions only to block direct current. Further capacitors can be formed in line 20 to add appreciable series capacitance to affect the frequency response of the device.

Two embodiments of the doped region 28 have been described in which the region follows the line 20 (as in FIG. 1) and in which it is a large rectangle extending under the path of the conductor. In the second embodiment, conduction takes place in region 28 largely at right angles to the lengths of the tortuous line 20, and diffusions extending in the direction of this conduction are useful. For example, diffusions under the capacitor 36 and under similar short ends of the conductive line are useful.

The equivalent circuit of FIG. 3 represents a single segment of the tortuous line 20 and illustrates the entire device 10. Other circuits of more or less detail can suitably represent the device of the drawing and variations within the scope of the invention.

While the invention has been particularly shown and described with reference to preferred embodiments thereof, it would be understood by those skilled in the art that the foregoing and other changes in form and detail may be made therein without departing from the spirit and scope of the invention.

What is claimed is:

1. A semiconductor device having a layer of semiconductor material having a predetermined conductivity, a ground plane on one face of the layer, an insulating layer on the other face of the semiconductor layer, and a conductive line overlying the insulating layer, wherein the improvement comprises, a higher conductivity region of said predetermined conductivity type formed between said insulating layer and said ground plane and adjacent said insulating layer to have relatively high capacitive coupling to said line and relatively low capacitive coupling to said ground plane and substantially conductively isolated from said line, and having a resistivity value to provide a preselected frequency response for the device, said semiconductor layer having a thickness selected to establish a selected value of inductance for said line, and said region of semiconductor material having generally the shape of said conductive line and underlying said line.

2. A device according to claim 1 in which said line has a tortuous shape with relatively long parallel sections and relatively short connecting sections, and said region of semiconductor material is located under selected ones of said short connecting sections of said line.

* * * * *